US008384734B2

(12) United States Patent
Knadler et al.

(10) Patent No.: US 8,384,734 B2
(45) Date of Patent: Feb. 26, 2013

(54) SYSTEM AND METHOD FOR USER SELECTABLE WHITE LEVEL

(75) Inventors: John M. Knadler, Round Rock, TX (US); Eugen Munteanu, Austin, TX (US); Jack D. Conway, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 500 days.

(21) Appl. No.: 12/755,035

(22) Filed: Apr. 6, 2010

(65) Prior Publication Data

US 2011/0242127 A1 Oct. 6, 2011

(51) Int. Cl.

| | |
|---|---|
| ***G09G 5/00*** | (2006.01) |
| ***G09G 5/02*** | (2006.01) |
| ***G09G 5/36*** | (2006.01) |
| ***G06T 15/60*** | (2006.01) |
| ***H04N 11/00*** | (2006.01) |
| ***H04N 5/46*** | (2006.01) |
| ***H04N 5/14*** | (2006.01) |
| ***H04N 1/46*** | (2006.01) |
| ***G03F 3/08*** | (2006.01) |
| ***G06K 9/00*** | (2006.01) |
| ***G06K 9/40*** | (2006.01) |
| ***G06F 17/00*** | (2006.01) |
| *H04N 1/387* | (2006.01) |
| *H04N 1/40* | (2006.01) |

(52) U.S. Cl. ........ 345/593; 345/426; 345/589; 345/600; 345/619; 345/548; 348/552; 348/557; 348/577; 358/516; 358/518; 358/461; 358/452; 382/163; 382/165; 382/254; 382/274; 382/275; 715/273; 715/275

(58) Field of Classification Search .................. 345/418, 345/426, 428, 581, 589, 593, 600, 617–619, 345/501, 548–549; 348/552–553, 557, 560, 348/562–563, 577, 582; 358/515–516, 518–520, 358/448, 461, 452–453; 382/162–165, 167, 382/254, 274, 276, 307; 715/273, 275, 700, 715/764

See application file for complete search history.

(56) References Cited

U.S. PATENT DOCUMENTS

| | | | | |
|---|---|---|---|---|
| 4,703,318 | A * | 10/1987 | Haggerty | 345/634 |
| 5,483,259 | A * | 1/1996 | Sachs | 345/600 |
| 6,172,681 | B1 | 1/2001 | Ueda | |
| 6,285,344 | B1 | 9/2001 | Everard et al. | |
| 6,417,863 | B1 | 7/2002 | Smith | |
| 6,657,611 | B1 | 12/2003 | Sterken et al. | |
| 6,972,772 | B1 | 12/2005 | Chen et al. | |
| 7,046,221 | B1 | 5/2006 | Malzbender | |
| 7,423,779 | B2 | 9/2008 | Shi | |
| 2002/0031263 | A1* | 3/2002 | Yamakawa | 382/199 |
| 2007/0063940 | A1* | 3/2007 | Juenger | 345/87 |
| 2007/0088966 | A1* | 4/2007 | Price et al. | 713/324 |

* cited by examiner

*Primary Examiner* — Wesner Sajous
(74) *Attorney, Agent, or Firm* — Larson Newman, LLP

(57) ABSTRACT

A method for implementing a user selectable white level includes displaying a default white patch of a default shade of white on a display, displaying a modified white patch of a modified shade of white that is different than the default shade of white on the display, receiving a selection of the modified white patch, associating another default shade of white with the modified shade of white in response to receiving the selection, receiving pixel data for a pixel, the pixel data comprising color information for displaying the default shade of white, and displaying the pixel with the second default shade of white.

20 Claims, 2 Drawing Sheets

SYSTEM AND METHOD FOR USER SELECTABLE WHITE LEVEL

FIELD OF THE DISCLOSURE

The present disclosure generally relates to information handling systems, and more particularly relates to a display system in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, and networking systems.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings. This focus is provided to assist in describing the teachings, and should not be interpreted as a limitation on the scope or applicability of the teachings. Other teachings can be used in this application. The teachings can also be used in other applications, and with different types of architectures, such as distributed computing architectures, client/server architectures, or middleware server architectures and associated resources.

An information handling system can include a graphics system. In a particular embodiment an information handling system provides a user interface to an included graphics system, such that a user of the information handling system can adjust a whiteness level of a portion of a displayed image. Such an adjustment can be performed on a single information handling system to meet a personal preference of the user, or to compensate for variations in the native whiteness level of a particular display panel. Such an adjustment can also be performed on multiple information handling systems to easily provide for a consistent look among the multiple information handling systems.

Figure 1:
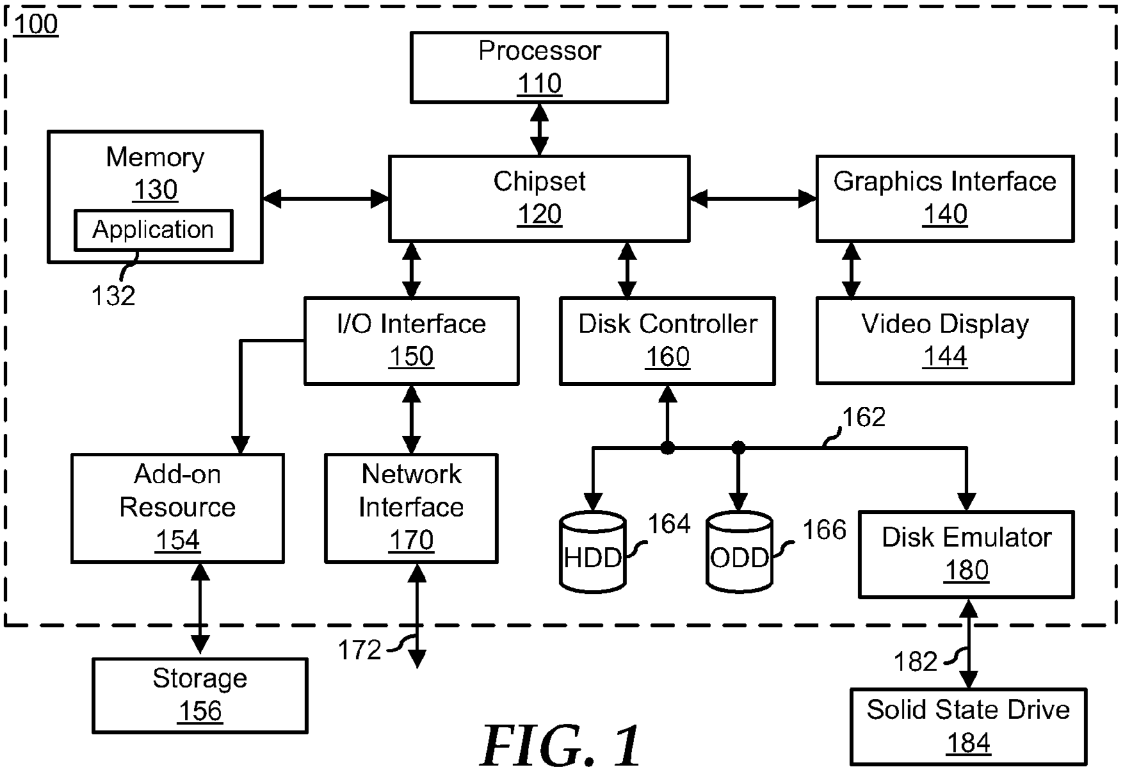
FIG. 1 is a functional block diagram illustrating an exemplary embodiment of an information handling system according to an embodiment of the present disclosure.

FIG. 1 illustrates a functional block diagram of an embodiment of an information handling system 100, including a processor 110, a chipset 120, a memory 130, a graphics interface 140, an input/output (I/O) interface 150, a disk controller 160, a network interface 170, and a disk emulator 180. In a particular embodiment, information handling system 100 is used to carry out one or more of the methods described below. In another embodiment, one or more of the systems described below are implemented in the form of an information handling system.

Chipset 120 is connected to and supports processor 110, allowing processor 110 to execute machine-executable code. In a particular embodiment (not illustrated), information handling system 100 includes one or more additional processors, and chipset 120 supports the multiple processors, allowing for simultaneous processing by each of the processors and permitting the exchange of information among the processors and the other elements of information handling system 100. Chipset 120 can be connected to processor 110 via a unique channel, or via a bus that shares information among processor 110, chipset 120, and other elements of information handling system 100.

Memory 130 is connected to chipset 120. Memory 130 and chipset 120 can be connected via a unique channel, or via a bus that shares information among chipset 120, memory 130, and other elements of information handling system 100. In particular, a bus can share information among processor 110, chipset 120 and memory 130. In another embodiment (not illustrated), processor 110 is connected to memory 130 via a unique channel. In another embodiment (not illustrated), information handling system 100 can include separate memory dedicated to each of the one or more additional processors. A non-limiting example of memory 130 includes static random access memory (SRAM), dynamic random access memory (DRAM), or non-volatile random access memory (NVRAM), read only memory (ROM), flash memory, another type of memory, or any combination thereof.

Graphics interface 140 is connected to chipset 120. Graphics interface 140 and chipset 120 can be connected via a unique channel, or via a bus that shares information among chipset 120, graphics interface 140, and other elements of information handling system 100. Graphics interface 140 is connected to a video display 144. Other graphics interfaces (not illustrated) can also be used in addition to graphics interface 140 if needed or desired. Video display 144 can include one or more types of video displays, such as a flat panel display or other type of display device.

I/O interface 150 is connected to chipset 120. I/O interface 150 and chipset 120 can be connected via a unique channel, or via a bus that shares information among chipset 120, I/O interface 150, and other elements of information handling system 100. Other I/O interfaces (not illustrated) can also be used in addition to I/O interface 150 if needed or desired. I/O interface 150 is connected to one or more add-on resources 154. Add-on resource 154 is connected to a storage system 156, and can also include another data storage system, a graphics interface, a network interface card (NIC), a sound/video processing card, another suitable add-on resource or any combination thereof.

Network interface device 170 is connected to I/O interface 150. Network interface 170 and I/O interface 150 can be coupled via a unique channel, or via a bus that shares information among I/O interface 150, network interface 170, and other elements of information handling system 100. Other network interfaces (not illustrated) can also be used in addition to network interface 170 if needed or desired. Network interface 170 can be a network interface card (NIC) disposed within information handling system 100, on a main circuit board (such as a baseboard, a motherboard, or any combination thereof), integrated onto another component such as chipset 120, in another suitable location, or any combination thereof. Network interface 170 includes a network channel 172 that provide interfaces between information handling system 100 and other devices (not illustrated) that are external to information handling system 100. Network interface 170 can also include additional network channels (not illustrated).

Disk controller 160 is connected to chipset 120. Disk controller 160 and chipset 120 can be connected via a unique channel, or via a bus that shares information among chipset 120, disk controller 160, and other elements of information handling system 100. Other disk controllers (not illustrated) can also be used in addition to disk controller 160 if needed or desired. Disk controller 160 can include a disk interface 162. Disk controller 160 can be connected to one or more disk drives via disk interface 162. Such disk drives include a hard disk drive (HDD) 164 or an optical disk drive (ODD) 166 (such as a Read/Write Compact Disk (R/W-CD), a Read/Write Digital Video Disk (R/W-DVD), a Read/Write mini Digital Video Disk (R/W mini-DVD), or another type of optical disk drive), or any combination thereof. Additionally, disk controller 160 can be connected to disk emulator 180. Disk emulator 180 can permit a solid-state drive 184 to be coupled to information handling system 100 via an external interface. The external interface can include industry standard busses (such as USB or IEEE 1384 (Firewire)) or proprietary busses, or any combination thereof. Alternatively, solid-state drive 184 can be disposed within information handling system 100.

Information handling system 100 includes a graphics system user interface application 132. Application 132 resides in memory 130, and includes machine-executable code that can be executed by processor 110 to display a user interface on video display 144. The user interface can include various screens that permit a user of information handling system 100 to adjust various operating parameters of graphics interface 140, and thereby modify the images displayed on video display 144. Graphics system user interface application 132 can be implemented as a single program, or as separate programs carrying out the various features as described below. In a particular embodiment (not illustrated), a graphics system user interface application resides in another storage medium of information handling system 100. For example, a graphics system user interface application can reside in HDD 164, in a ROM (not illustrated) associated with information handling system 100, in an option-ROM (not illustrated) associated with graphics interface 140, in storage system 156, in a storage system (not illustrated) associated with network channel 172, in another storage medium of information handling system 100, or a combination thereof.

Figure 2:
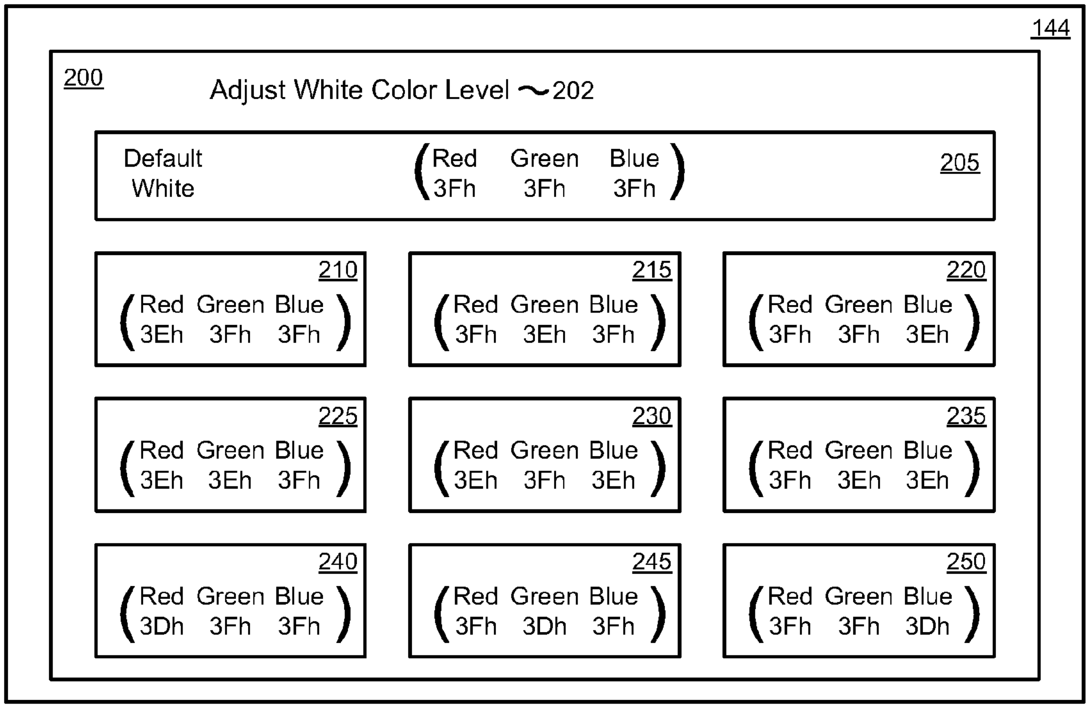
FIG. 2 is an illustration of a white color level adjustment screen depicted on a video display according to an embodiment of a graphics system user interface application.

FIG. 2 illustrates a white color level adjustment screen 200 depicted on video display 144 of an embodiment of graphics system user interface application 132. White color level adjustment screen 200 includes a title banner 202, a default white patch 205, and adjusted white patches 210-250. White patches 205-250 provide fields of various shades of white, as displayed on video display 144. White patches 205-250 are selectable by the user, and provide a method to select a desired shade of white for display on video display 140 when a particular pixel of video display 140 is directed to present a white appearance.

Graphics interface 140 receives graphics information and processes it into a format that is usable by video display 144. In a particular embodiment, the color of a particular pixel of video display 144 is determined by an 18-bit color field, where six bits specify an intensity level of a red color element of the pixel, six bits specify an intensity level of a green color element of the pixel, and six bits specify an intensity level of a blue color element of the pixel. Thus each color element can be controlled to provide 64 ($2^6$) intensity levels, from turned off to fully turned on. For example, providing a particular color element with a bit field with the value of "000000" (00h) can direct the element to be turned off, providing the element with a bit field with the value of "111111" (3Fh) can direct the element to be fully turned off, and values between 00h and 3Fh can provide substantially linear intensity levels for the element. In this way, each pixel is operable to provide over 256K ($2^{18}$) different color shades. A white pixel can be coded by directing each of the red, green, and blue elements to their full intensity levels. That is, a white pixel can be obtained by providing the pixel with a red intensity level of 3Fh, a green intensity level of 3Fh, and a blue intensity level of 3Fh. Other pixel encoding schemes can be used to provide for color palates of more or less colors, and pixels can be composed of combinations of elements other than red, green, and blue, as needed or desired.

As illustrated, default white patch 205 is composed of pixels that are driven with a color field value of "3Fh 3Fh 3Fh," and each color element of each pixel in default white patch 205 is driven to the fullest intensity level. Adjusted white patch 210 is composed of pixels that are driven with a color field value of "3Eh 3Fh 3Fh." Here each red color element of each pixel is driven with an offset of one step lower than the fullest intensity level and each green color element and each blue color element of each pixel is driven to the fullest intensity level, resulting in a slightly different shade of white being displayed in adjusted white patch 210 than in default white patch 205. Adjusted white patches 215-250 are similarly composed of pixels that are driven with the illustrated color field values, and the associated color elements of each pixel are driven with the associated offset to the fullest intensity level, resulting in other slightly different shades of white being displayed.

When a user selects default white patch 205, as for example, by placing a mouse over default white patch 205 and clicking a mouse button, then a default color processing is performed by graphics interface 140 in providing pixel information to video display 144, where each pixel is driven with default color field values. However, when one of adjusted color patches 210-250 is selected, then graphics interface 140 performs processing on the pixel information provided to video display 144, where the color field values for each pixel is modified as described below.

In a particular embodiment, graphics interface 140 applies the offset associated with the selected adjusted white patch 210-250 to the graphics information in a uniform way, such that all of the pixel color fields are modified in the same way, regardless of the intended color of each particular pixel. For example, if adjusted white patch 230 is selected, then graphics interface 140 applies an offset of one step lower than the fullest intensity level for the red and blue elements for all pixels in video display 144. Thus, if a particular pixel is originally intended to display a color associated with a color field value of "2Bh 84h 1Ch," then graphics interface 140 applies a one step offset to the red and blue elements and sends a color field value of "2Ah 84h 1Bh" to the pixel. In this way, the color level of pixels that are intended to display the color white, that is pixels with a color field value of "3Fh 3Fh 3Fh," actually display the selected white color "3Eh 3Fh 3Eh," and all other colors are similarly offset. In another embodiment, graphics interface 140 detects the color field value for each pixel, and only applies the offset associated with the selected adjusted white patch 210-250 when a particular pixel is intended to display white. That is, only pixels with the color field value of "3Fh 3Fh 3Fh" will be modified to the selected adjusted white patch 210-250.

Note that the number and character of adjusted white patches 210-250 in white color level adjustment screen 200 are illustrative, that more or less adjusted white patches can be displayed, and that different offsets values than the offset values shown can be utilized. Also, in each case, the elements depicted on the white color level adjustment screen 200 are illustrative, and are not meant to limit the content that may be displayed on video display device 144. For example, the information included in white color level adjustment screen 200 may be shown alone, or in combination with other information.

Figure 3:
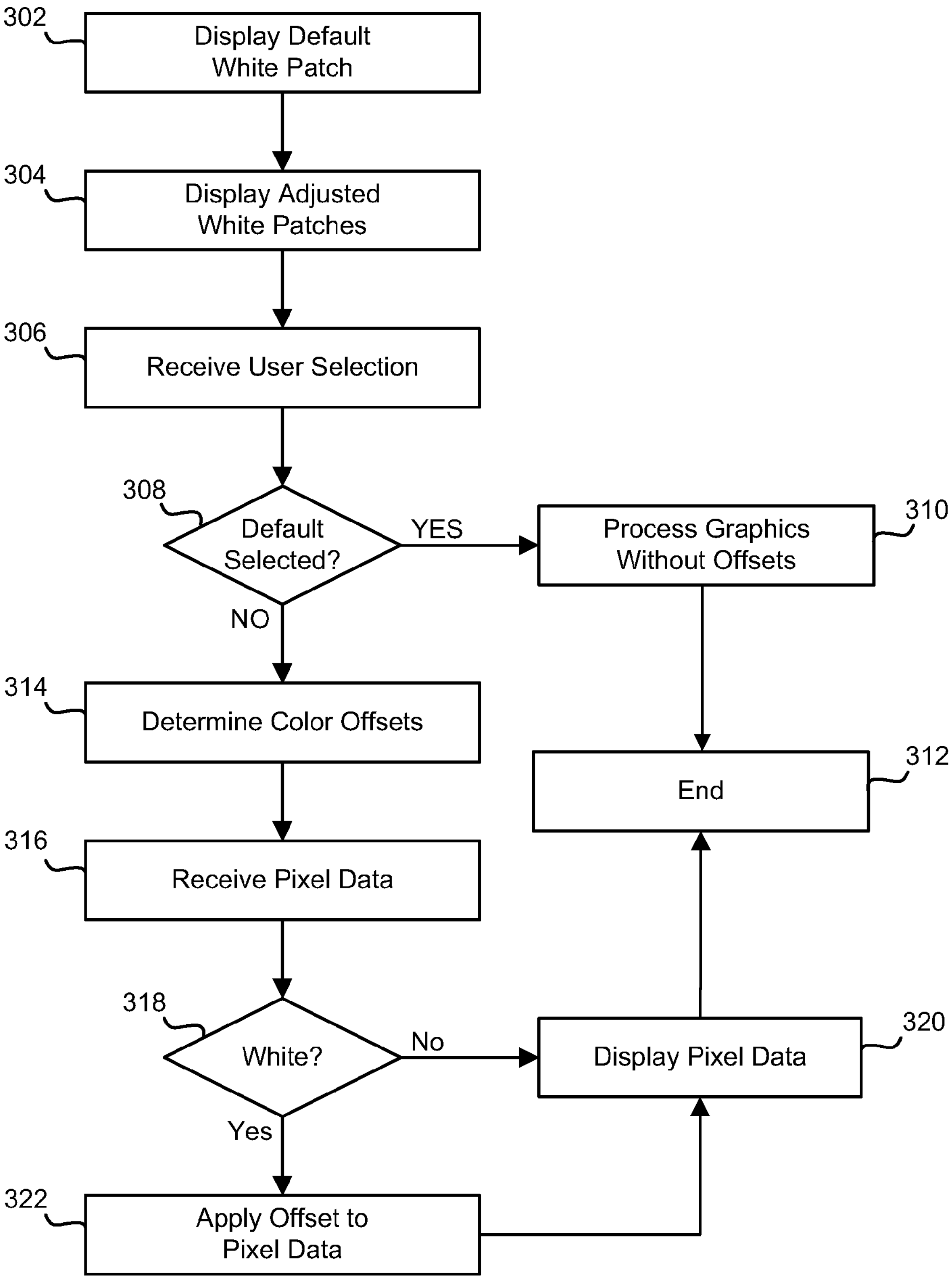
FIG. 3 is a flow chart illustrating a method of providing a user selectable white level.

FIG. 3 illustrates an embodiment of a method of providing a user selectable white level in a flowchart form. A white patch with a default white level is displayed on a video display in block 302. For example, a patch of pixels with color levels of "3Fh 3Fh 3Fh" can be displayed on video display 144 as the default white patch. One or more adjusted white level patches are displayed on the video display in block 304. Here patches of pixels can be displayed on video display 144. The pixels in each patch can have a substantially white color, but with different offsets to the red, the green, or the blue elements applied. For example, three adjusted white patches can be displayed, each with an offset of two steps of intensity level applied to the red elements, the green elements, or the blue elements, resulting in patches with color levels of "3Dh 3Fh 3Fh," "3Fh 3Dh 3Fh," and "3Fh 3Fh 3Dh," respectively.

A user selection of a particular white patch is received in block 306. For example, a user may use a computer mouse to select either the default white patch or one of the adjusted white patches, as displayed on video display 144. A decision is made as to whether or not the default white patch was selected in decision block 308. If so, the "YES" branch of decision block 308 is taken, graphics information is processed without determining or using intensity level offsets in block 310, and processing ends in block 312. If the default white patch was not selected, the "NO" branch of decision block 308 is taken, and the intensity level offsets associated with the selected adjusted white patch are determined in block 314. Here, if an adjusted white patch with a color level of "3Fh 3C 3Dh" is selected, then the offsets are determined to be zero steps of red intensity level offset, three steps of green intensity level offset, and two steps of blue intensity level offset. Pixel data for a particular pixel is received in block 316. For example, graphics interface 140 may receive graphics information associated with a program's graphics output and that includes pixels data that describes the color levels for each pixel of graphics display 144. A decision is made as to whether or not a particular pixel is intended to be displayed as a white pixel in decision block 318. If not, the "NO" branch of decision block 318 is taken, the pixel is displayed with the color levels specified in the pixel data in block 320, and processing ends for that particular pixel in block 312. If the particular pixel is intended to be displayed as a white pixel, the "YES" branch of decision block 318 is taken, the offsets are applied to the color levels in block 322, the pixel is displayed with the modified color levels in block 320, and processing ends for that particular pixel in block 312.

In the embodiments described above, an information handling system can include any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device and can vary in size, shape, performance, functionality, and price. The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphics display, or any combination thereof. The information handling system can also include one or more buses operable to transmit communications between the various hardware components. Portions of an information handling system may themselves be considered information handling systems.

When referred to as a "device," a "module," or the like, the embodiments described above can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:

displaying a first default white patch on a display, wherein the first default white patch comprises pixels displaying a first default shade of white;

displaying a first modified white patch on the display, wherein the first modified white patch comprises pixels displaying a first modified shade of white, wherein the first modified shade of white is different than the first default shade of white;

receiving a selection of the first modified white patch;

associating a second default shade of white with the first modified shade of white in response to receiving the selection of the first modified white patch;

receiving pixel data for a first particular pixel, the pixel data comprising color information for displaying the first default shade of white; and displaying the first particular pixel with the second default shade of white.

2. The method of claim 1, further comprising;

receiving a selection of the first default white patch; and displaying the first particular pixel with the first default shade of white.

3. The method of claim 1, further comprising;

displaying a second modified white patch on the display, wherein the second modified white patch comprises pixels displaying a second modified shade of white;

receiving a selection of the second modified white patch;

associating a third default shade of white with the second modified shade of white in response to receiving the selection of the second modified white patch; and displaying the first particular pixel with the third default shade of white.

4. The method of claim 3, wherein:

the first default shade of white is formed at a second particular pixel by directing each of a plurality of color elements for the second particular pixel to output a highest intensity level; and the second default shade of white is formed at the second particular pixel by directing at least one of the plurality of color elements to output less than the highest intensity level.

5. The method of claim 4, wherein the third default shade of white is formed at the second particular pixel by directing at least one of the plurality of color elements to output a different intensity level than either the first default shade of white or the second default shade of white.

6. The method of claim 5, wherein the second default shade of white is characterized by an offset associated with each of the at least one of the plurality of color elements, each offset being determined as the amount less than the highest intensity level that each of the plurality of color elements is directed to output.

7. The method of claim 6, wherein displaying the first particular pixel with the second default shade of white further comprises applying the offset to the pixel data.

8. The method of claim 4, wherein the plurality of color elements comprise a red color element, a green color element, and a blue color element.

9. Machine-executable code embedded within a tangible storage medium and including instructions for carrying out a method comprising:

displaying a default white patch, wherein the default white patch comprises pixels displaying a default shade of white;

displaying a first modified white patch, wherein the first modified white patch comprises pixels displaying a first modified shade of white;

receiving a selection of the first modified white patch;

receiving pixel data for a first particular pixel, the pixel data comprising color information for displaying the default shade of white; and displaying the first particular pixel with the first modified shade of white.

10. The machine-executable code of claim 9, the method further comprising;

receiving a selection of the default white patch; and displaying the first particular pixel with the default shade of white.

11. The machine-executable code of claim 9, the method further comprising;

displaying a second modified white patch on the display, wherein the second modified white patch comprises pixels displaying a second modified shade of white;

receiving a selection of the second modified white patch; and displaying the first particular pixel with the second modified shade of white.

12. The machine-executable code of claim 11, wherein:

the default shade of white is formed at a second particular pixel by directing each of a plurality of color elements for the second particular pixel to output a highest intensity level; and the first modified shade of white is formed at the second particular pixel by directing at least one of the plurality of color elements to output less than the highest intensity level.

13. The machine-executable code of claim 12, wherein the second modified shade of white is formed at the second particular pixel by directing at least one of the plurality of color elements to output a different intensity level than either the default shade of white or the first modified shade of white.

14. The machine-executable code of claim 13, wherein the first modified shade of white is characterized by an offset associated with each of the at least one of the plurality of color elements, each offset being determined as the amount less than the highest intensity level that each of the plurality of color elements is directed to output.

15. The machine-executable code of claim 14, wherein displaying the first particular pixel with the first modified shade of white further comprises applying the offset to the pixel data.

16. The machine-executable code of claim 12, wherein the plurality of color elements comprise a red color element, a green color element, and a blue color element.

17. An information handling system comprising:

a display; and a graphics interface operable to carry out a method comprising:

displaying a default white patch on the display, wherein the default white patch comprises pixels displaying a default shade of white;

displaying a first modified white patch on the display, wherein the first modified white patch comprises pixels displaying a first modified shade of white;

receiving a selection of the first modified white patch;

receiving pixel data for a first particular pixel, the pixel data comprising color information for displaying the default shade of white; and displaying the first particular pixel on the display with the first modified shade of white.

18. The information handling system of claim 17, the method further comprising:

displaying a second modified white patch on the display, wherein the second modified white patch comprises pixels displaying a second modified shade of white;

receiving a selection of the second modified white patch; and displaying the first particular pixel on the display with the second modified shade of white.

19. The information handling system of claim 18, wherein:

the default shade of white is formed at a second particular pixel by directing each of a plurality of color elements for the second particular pixel to output a highest intensity level; and the first modified shade of white is formed at the second particular pixel by directing at least one of the plurality of color elements to output less than the highest intensity level.

20. The information handling system of claim 19, wherein:

the first modified shade of white is characterized by an offset associated with each of the at least one of the plurality of color elements, each offset being determined as the amount less than the highest intensity level that each of the plurality of color elements is directed to output; and displaying the first particular pixel with the first modified shade of white further comprises applying the offset to the pixel data.

* * * * *